(12) United States Patent
Ohishi

(10) Patent No.: US 7,982,417 B2
(45) Date of Patent: Jul. 19, 2011

(54) STAGE UNIT, EXPOSURE APPARATUS, AND DEVICE MANUFACTURING METHOD

(75) Inventor: Shinji Ohishi, Oyama (JP)

(73) Assignee: Canon Kabushiki Kaisha, Tokyo (JP)

( * ) Notice: Subject to any disclaimer, the term of this patent is extended or adjusted under 35 U.S.C. 154(b) by 243 days.

(21) Appl. No.: 12/420,601

(22) Filed: Apr. 8, 2009

(65) Prior Publication Data

US 2009/0251678 A1 Oct. 8, 2009

(30) Foreign Application Priority Data

Apr. 8, 2008 (JP) ................. 2008-100417

(51) Int. Cl.
*H02K 41/00* (2006.01)
*H02P 7/00* (2006.01)
*H01L 21/027* (2006.01)
*H01L 21/68* (2006.01)

(52) U.S. Cl. .................. 318/135; 310/12.06; 310/12.21; 355/53

(58) Field of Classification Search ............... 310/12.05, 310/12.06, 12.21; 318/135
See application file for complete search history.

(56) References Cited

U.S. PATENT DOCUMENTS

| | | | | |
|---|---|---|---|---|
| 5,666,038 A | * | 9/1997 | Ohishi | 318/625 |
| 5,841,250 A | * | 11/1998 | Korenage et al. | 318/135 |
| 6,590,633 B1 | * | 7/2003 | Nishi et al. | 355/53 |
| 7,075,197 B2 | | 7/2006 | Korenaga | |
| 7,199,493 B2 | * | 4/2007 | Ohishi | 310/12.31 |
| 2004/0126907 A1 | | 7/2004 | Korenaga | |
| 2005/0194843 A1 | | 9/2005 | Korenaga | |
| 2006/0202568 A1 | | 9/2006 | Korenaga | |
| 2006/0209280 A1 | | 9/2006 | Makita et al. | |

FOREIGN PATENT DOCUMENTS

| | | |
|---|---|---|
| JP | 8-111998 | 4/1996 |
| JP | 2004-187401 A | 7/2004 |
| JP | 2005-253179 | 9/2005 |
| JP | 2006-261607 A | 9/2006 |
| JP | 2008-022700 A | 1/2008 |

\* cited by examiner

*Primary Examiner* — Burton Mullins

(74) *Attorney, Agent, or Firm* — Canon USA Inc IP Division

(57) ABSTRACT

A stage unit includes the following elements. A stator includes a first coil array in which first coils extending in the x direction are arranged in the y direction, a second coil array in which second coils extending in the x direction are arranged in the y direction and which is located next to the first coil array in the x direction, and a third coil array in which third coils extending in the y direction are arranged in the x direction and which covers the first and second coil arrays. A movable member moves above the stator. A controller controls driving of the movable member by allowing current amplifiers to supply current to the coils included in the first, second, and third coil arrays. A switch is capable of connecting the first coil to the second coil.

13 Claims, 16 Drawing Sheets

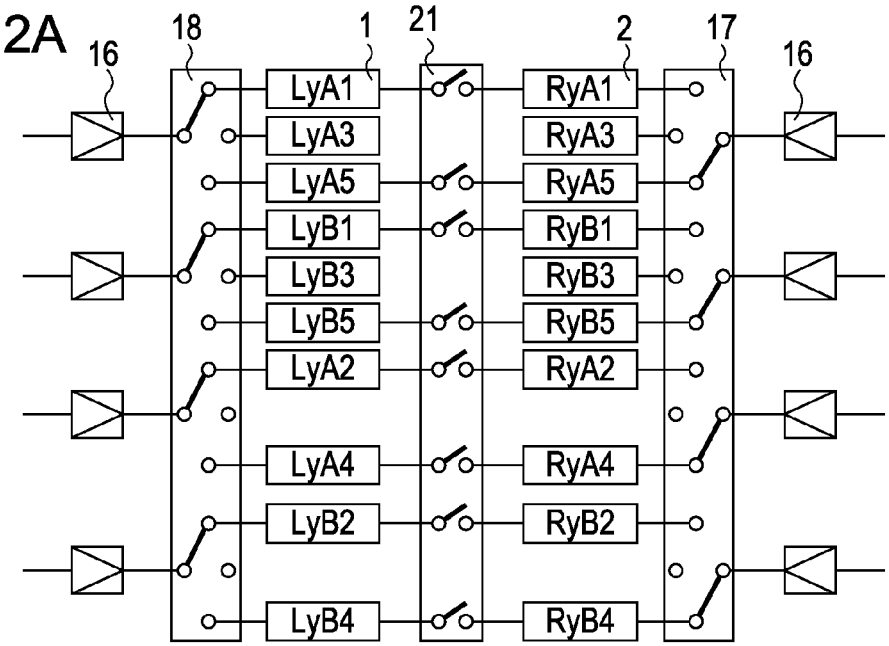
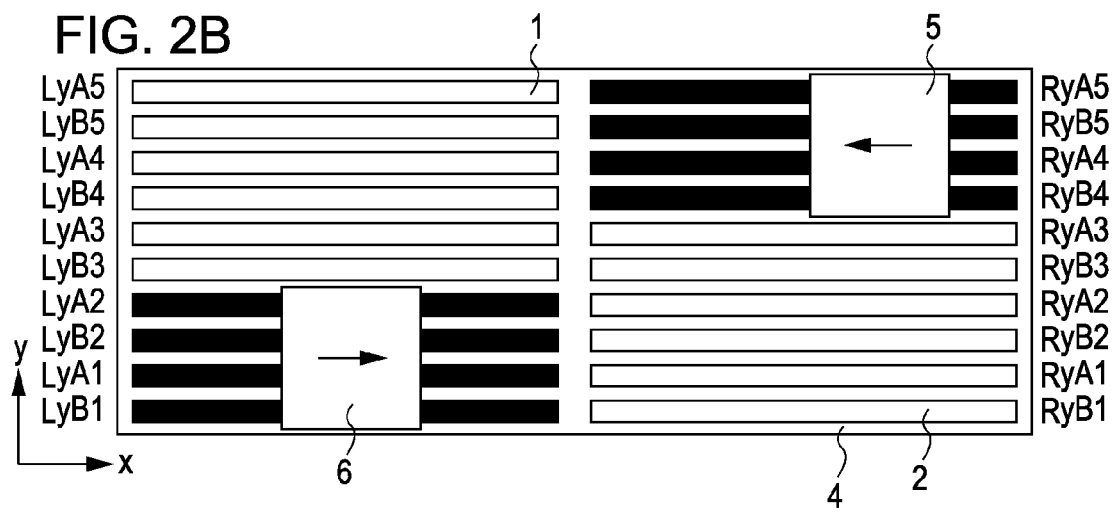
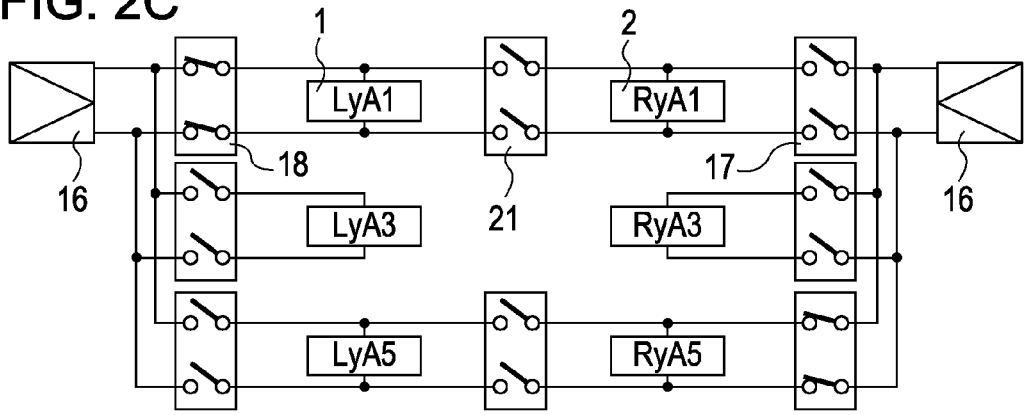

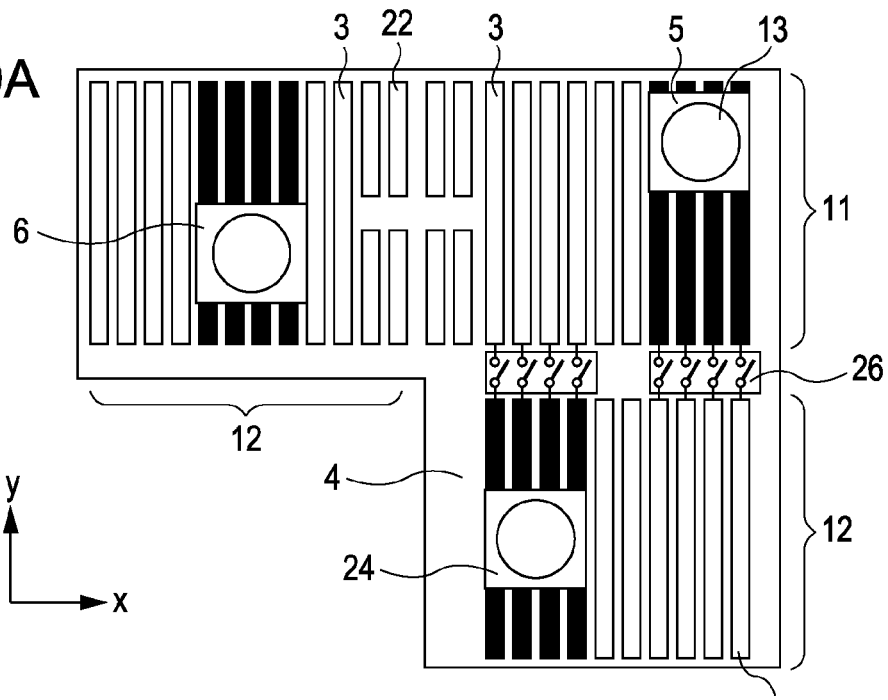
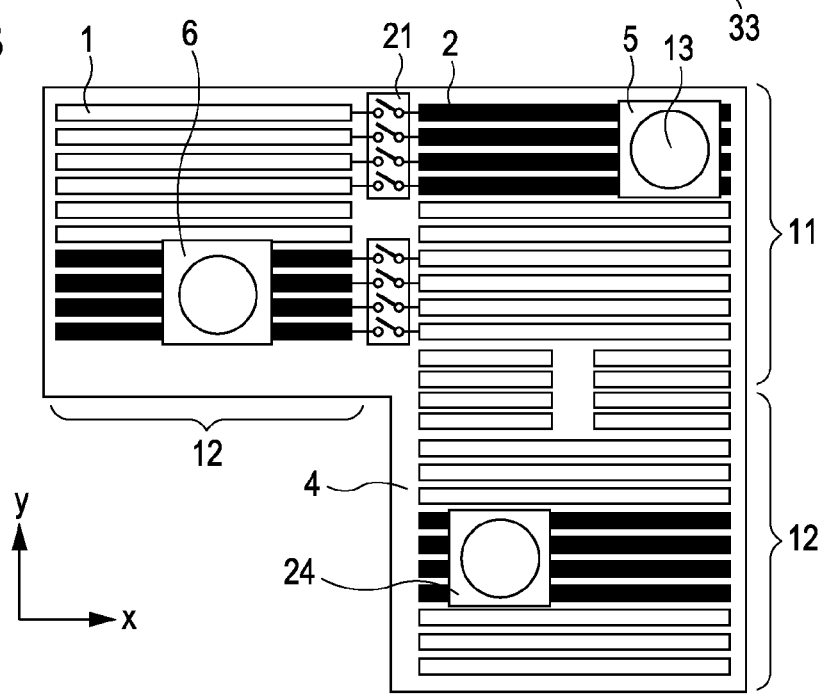
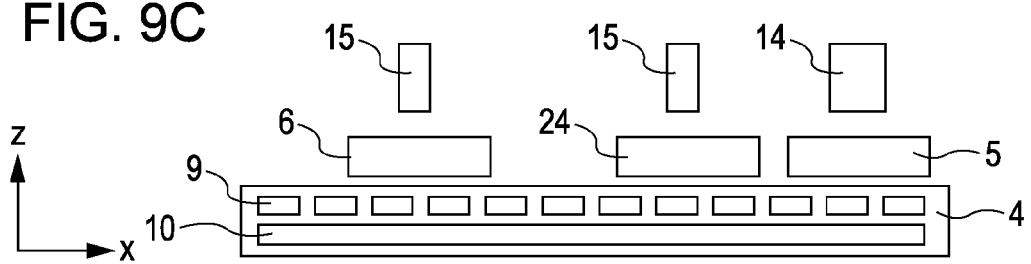

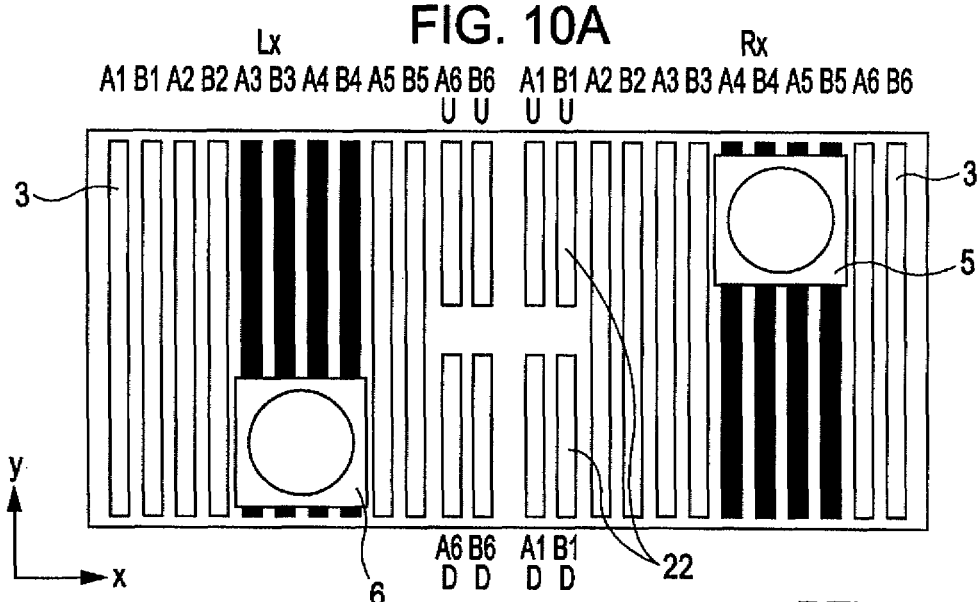
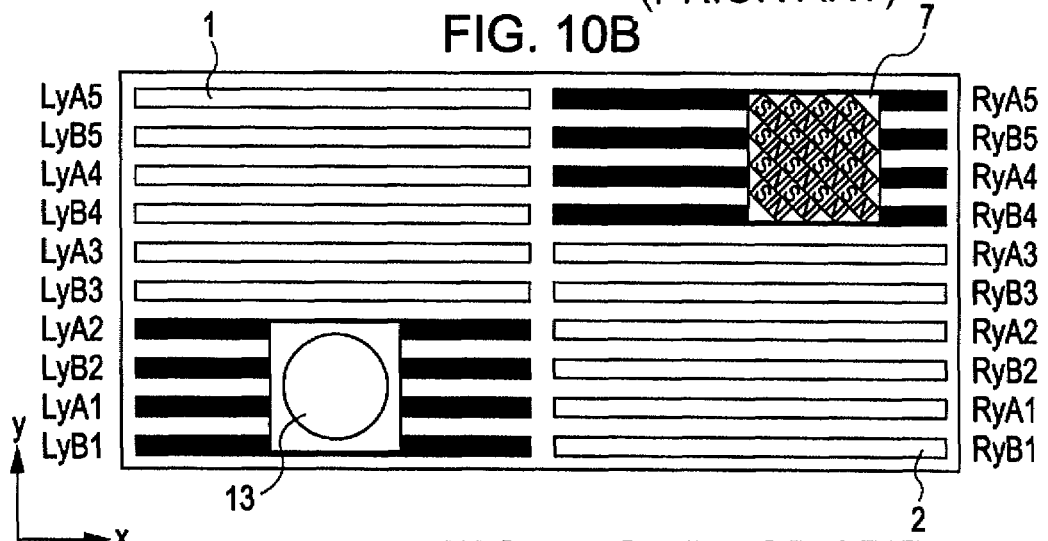
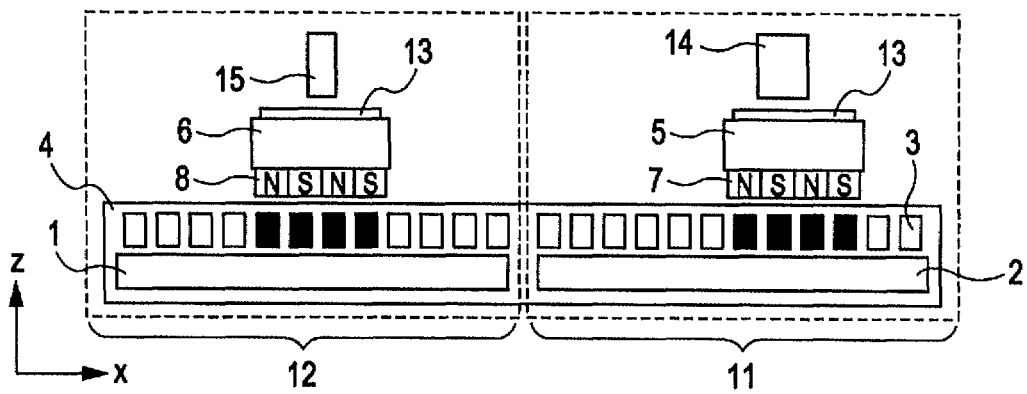

STAGE UNIT, EXPOSURE APPARATUS, AND DEVICE MANUFACTURING METHOD

BACKGROUND OF THE INVENTION

1. Field of the Invention

The present invention relates to stage units for positioning an object, and in particular, relates to a stage unit suitable to position a substrate or an original in a manufacturing apparatus, e.g., an exposure apparatus, for manufacturing a device, such as a semiconductor device or a liquid crystal device.

2. Description of the Related Art

As for stage units, used in exposure apparatuses, requiring high-accuracy positioning, a stage unit including a planar motor has attracted attention. Regarding wafer stages, attention has focused on a twin stage structure in which two movable stages are provided. An exposure operation for exposing a wafer to form a pattern on the wafer is performed simultaneously with a measurement operation for measuring the position of a previously formed pattern, so that an increase in throughput can be expected. Japanese Patent Laid-Open No. 2005-253179 discloses a stage unit including a planar motor. One of circuits for driving a linear motor including many coils is an excitation-switching driving circuit. Japanese Patent Laid-Open No. 8-111998 discloses such a driving circuit.

FIGS. 10A to 10C illustrate a related-art twin stage unit including a planar motor. FIG. 10A illustrates arrays of coils disposed in the x direction within a stator. FIG. 10B illustrates arrays of coils disposed in the y direction. FIG. 10C is a side elevational view of the entire stage unit.

Referring to FIG. 10B, the stage unit includes a first coil array 1 in which first coils having a length in the x direction (i.e., extending in a first direction) are arranged in the y direction and a second coil array 2 in which second coils extending in the x direction are arranged in the y direction. The two coil arrays are disposed adjacent to each other in the x direction.

In addition, a third coil array 3 in which third coils having a length in the y direction (i.e., extending in a second direction) are arranged in the x direction is placed within the stator 4 such that the third coil array 3 covers the first coil array 1 and the second coil array 2 as shown in FIG. 10C. To describe an operation for switching between the coils, reference symbols, e.g., LxA1, RyA5, and other similar symbols are assigned to the respective coils as shown in the figures.

Above the stator 4, a first stage 5 and a second stage 6 are arranged. A first movable member 7 and a second movable member 8, each including permanent magnets, are attached to vertically lower portions of the stages 5 and 6, respectively.

The principle that the movable members including permanent magnets are allowed to generate a horizontal force (drag) and a vertical force (lift) will now be described in brief with reference to FIGS. 15A and 15B.

The first movable member 7 includes a plurality of magnets. The magnets are magnetized in the directions indicated by dashed arrows and are arranged in a so-called Halbach array. Coils are disposed out of phase with the magnets. In the positional relationship between the magnets and the coils shown in FIGS. 15A and 15B, when current flows through the coils, forces indicated by solid arrows are produced due to the Lorentz force. As for the directions of the forces, when current is supplied to the coils in the vertical magnetic flux density, the coils produce a horizontal drag force. Whereas, when current is supplied to the coils in the horizontal magnetic flux density, the coils produce a vertical force. This is the force that allows the movable member 7 to move away from (i.e., lift off) the stator 4. Referring to FIGS. 15A and 15B, the force allowing the movable member 7 to move away from the stator 4 can be produced by either upper coils 9 or lower coils 10. The force produced by supplying current to the upper coils 9 close to the permanent magnets in the movable member 7 is larger than that obtained by supplying current to the lower coils 10. Accordingly, a current supplied to the upper coils 9 can be lower than that supplied to the lower coils 10. Supplying currents of two types, A phase and B phase, to the coils such that the currents are 90 degrees out of phase can produce constant forces.

As described above, the Lorentz force is produced by the permanent magnets and the currents flowing through the coils, so that the movable stage is driven in six axial directions under its own weight and is then positioned. Assuming that the first stage 5 and the second stage 6 are located as shown in FIGS. 10A to 10C, when the currents are supplied to the coils, filled with black in FIGS. 10A to 10C, facing the first movable member 7 and the second movable member 8, the Lorentz force is produced. In this example, four coils are selected for each stage in each of the x and y directions. Since the number of coils supplied with current varies depending on the size of the movable member, a predetermined number of coils best suited to drive the movable member may be selected.

Referring to FIG. 10C, a space, including the first coil array 1, surrounded by a dashed line corresponds to a measurement station 12 and another space, including the second coil array 2, surrounded by a dashed line corresponds to an exposure station 11. In an upper portion of the exposure station 11, a projection optical system 14, e.g., a projection lens, is provided to expose a substrate (wafer) 13 mounted on the first stage 5 to form a pattern. In an upper portion of the measurement station 12, a measurement optical system 15 is provided. The measurement optical system 15 includes at least one of a measuring device that measures the position of the surface of the substrate in the direction parallel to the optical axis of the projection optical system 14 and a measuring device that measures the position of a mark formed in the substrate.

A coil switching sequence in the movement of a stage will now be described. FIGS. 11A and 11B illustrate a case where the first stage 5 moves in the −x direction by a distance corresponding to the width of one coil and the second stage 6 moves in the +x direction by the same distance. Each arrow in FIGS. 11A and 11B indicates the direction in which the stage moves.

When the first stage 5 moves in the −x direction, a coil RxB5, indicated by hatching, does not face the first stage 5. The excitation of the coil RxB5 is therefore switched off and that of a coil RxB3 having the same phase relation as that of the coil RxB5 is newly switched on, thus performing excitation switching. Similarly, when the second stage 6 moves in the +x direction, a coil LxA3, indicated by hatching, does not face the second stage 6. The excitation of the coil LxA3 is therefore switched off and that of a coil LxA5 having the same phase relation as that of the coil LxA3 is switched on, thus performing excitation switching. The above-described switching of the excitation of the coils having the same phase relation through a switch in accordance with the position of the stage can continuously produce a drag force.

FIG. 12 illustrates a switching circuit for the first to third coil arrays. A stage controller (not illustrated) gives a current instruction to each current amplifier 16. A first switch group 17 for switching between coils in the second coil array 2, a second switch group 18 for switching between coils in the first coil array 1, and third switch groups 19 for switching between coils in the third coil array 3 are arranged.

FIG. 12 illustrates appropriate switching in the first to third switch groups so that current can be supplied to predetermined coils when the stages are located as shown in FIGS. 11A and 11B. The coils having the same phase relation are grouped, switching is performed between the coils in each group, and the selected coil is excited using a single current amplifier, so that the number of current amplifiers is reduced. To drive the two stages in the exposure station 11 and the measurement station 12, respectively, eight current amplifiers 16 in each station, namely, 16 current amplifiers in total have to be excited.

FIGS. 13A and 13B illustrate a coil switching sequence during a swapping operation in which the two stages are interchanged such that the first stage 5 is moved from the exposure station 11 to the measurement station 12 and the second stage 6 is moved from the measurement station 12 to the exposure station 11.

In the vicinity of the middle of the stator 4, currents supplied to the two stages have to be controlled independently of each other so that the two stages are interchanged. As shown in FIG. 13A, therefore, in the vicinity of the middle of the stator 4, a fourth coil array 22 is located next to one segment of the third coil array 3 in the exposure station 11. In the fourth coil array 22, each pair of fourth coils, each extending in the y direction, is placed in the y direction and the pairs of fourth coils are disposed in the x direction. In the measurement station 12, the other segment of the third coil array 3 is placed next to the fourth coil array 22.

It is assumed that the swapping operation for interchanging the first stage 5 and the second stage 6 is performed such that the first stage 5 travels in an upper portion in FIG. 13A in the vicinity of the middle of the stator 4 while moving in the −x direction and the second stage 6 travels in a lower portion in the figure in the vicinity thereof while moving in the +x direction. When the stages are located above both of the first coil array 1 and the second coil array 2 as shown in FIG. 13B, eight hatched coils have to also be excited.

FIG. 14 illustrates a coil switching circuit for achieving the swapping operation in which the two stages are interchanged between the exposure station 11 and the measurement station 12. Eight current amplifiers 20, surrounded by dashed lines, for swapping are further needed. Thus, 24 current amplifiers in total achieve the swapping operation for interchanging the stages.

As described above, when the excitation-switching driving circuit with the switch arrangement disclosed in Japanese Patent Laid-Open No. 8-111998 is applied to the twin stage unit including the planar motor disclosed in Japanese Patent Laid-Open No. 2005-253179, many current amplifiers are needed during the swapping operation for interchanging the two stages. Disadvantageously, the necessity of the many current amplifiers results in an increase in cost and further results in an increase in footprint of an electrical component rack.

SUMMARY OF THE INVENTION

The present invention provides a positioning stage unit capable of achieving the swapping operation for interchanging a plurality of stages with a simple structure without increasing the number of current amplifiers.

According to an aspect of the present invention, a stage unit includes the following elements. A stator includes a first coil array in which first coils extending in a first direction are arranged in a second direction perpendicular to the first direction, a second coil array in which second coils extending in the first direction are arranged in the second direction and which is located next to the first coil array in the first direction, and a third coil array in which third coils extending in the second direction are arranged in the first direction and which covers the first and second coil arrays. A movable member includes a magnet located above the stator and a stage to which the magnet is attached. A controller controls driving of the movable member by allowing a current amplifier to supply current to the coils extending in the first direction and allowing another current amplifier to supply current to the coils extending in the second direction. A switch is capable of connecting the first coil to the second coil.

Further features of the present invention will become apparent from the following description of exemplary embodiments with reference to the attached drawings.

BRIEF DESCRIPTION OF THE DRAWINGS

FIGS. 2A to 2C are diagrams explaining the first embodiment (before swapping).

FIGS. 9A to 9C are diagrams illustrating the structure of a triple stage unit according to a third embodiment of the present invention.

FIGS. 10A to 10C are diagrams illustrating the structure of a related-art twin stage unit including a planar motor.

DESCRIPTION OF THE EMBODIMENTS

The structure of a twin stage unit including a planar motor in accordance with a first embodiment of the present invention is the same as that shown in FIGS. 10A to 10C. The stage unit includes a first coil array 1 in which first coils extending in the x direction are arranged in the y direction perpendicular to the x direction and a second coil array 2 in which second coils extending in the x direction are arranged in the y direction. The two coil arrays are disposed adjacent to each other in the x direction.

In addition, a third coil array 3 in which third coils extending in the y direction are arranged in the x direction is placed within a stator 4 such that the third coil array 3 covers the first coil array 1 and the second coil array 2 as shown in FIG. 10C. To describe an operation for switching between the coils, reference symbols, e.g., LxA1, RyA5, and other similar symbols are assigned to the respective coils as shown in the figures.

Figure 1:
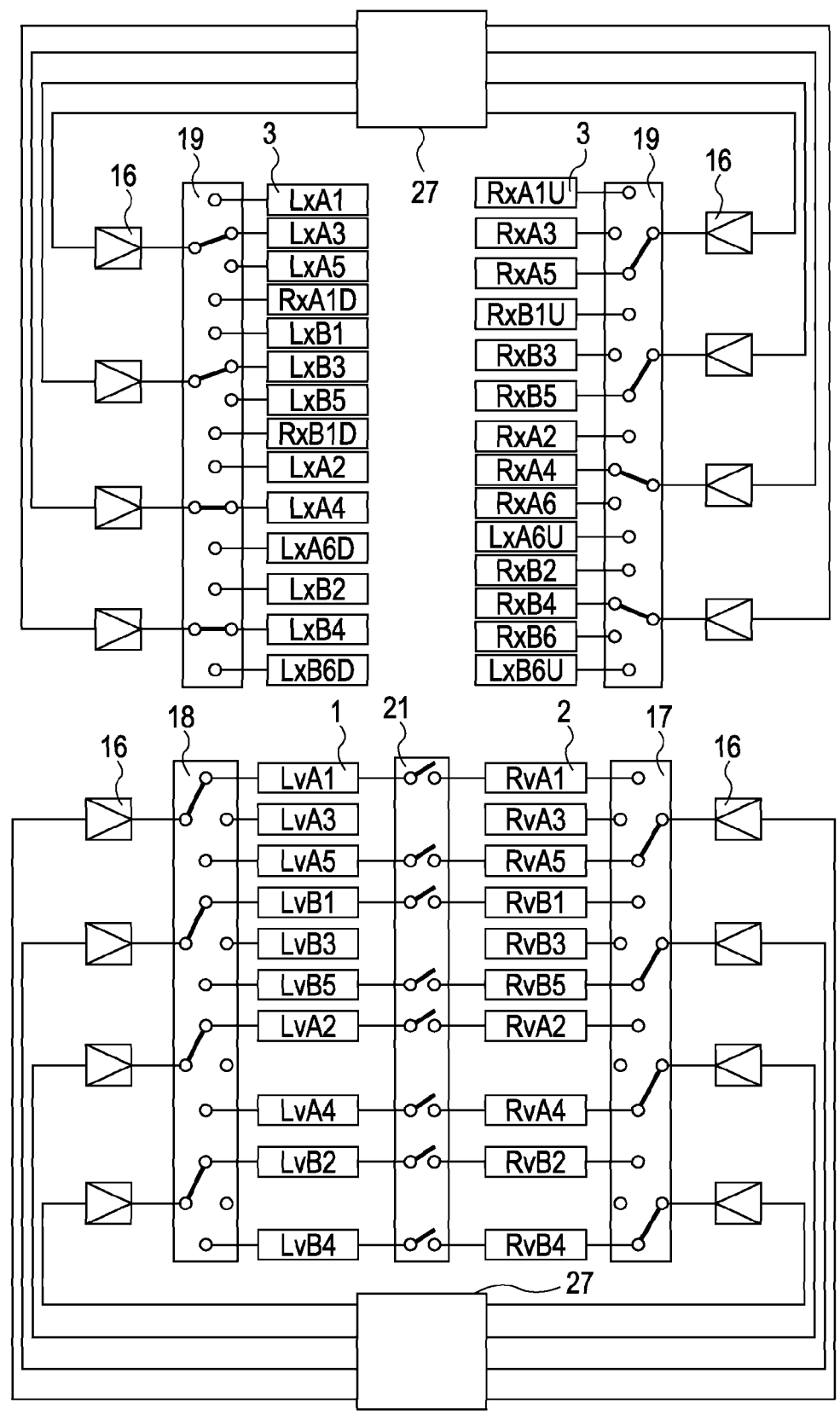
FIG. 1 illustrates a coil switching circuit according to a first embodiment of the present invention.

FIG. 1 illustrates a coil switching circuit in the stage unit according to the first embodiment of the present invention. The unit includes a fourth switch group 21 capable of connecting some coils in the second coil array 2 placed in an exposure station 11 to some coils in the first coil array 1 placed in a measurement station 12. The unit further includes a stage controller 27 that gives a current instruction to each current amplifier 16.

An operation of the coil switching circuit during the swapping operation in which the stages are interchanged will now be described. For the sake of brevity, the stage controller 27 is not shown in FIG. 2A and the subsequent figures. It is needless to say that the respective current amplifiers are connected to the stage controllers 27.

Referring to FIG. 2B, in this embodiment, a first movable member including a first magnet (not shown) and a first stage 5 and a second movable member including a second magnet (not shown) and a second stage 6 are driven above the stator 4. When these stages are used in an exposure apparatus, a first substrate (e.g., a wafer) is mounted on the first stage 5 and a second substrate (e.g., a wafer) is mounted on the second stage 6.

While the respective stages are subjected to the exposure operation and the measurement operation in the respective stations, the fourth switch group 21 is turned off (open) to disconnect the first coil array 1 from the second coil array 2 as shown in FIG. 2A. Some coils in the exposure station 11 are connected through the first switch group 17 to the current amplifiers 16, respectively, and some coils in the measurement station 12 are connected through the second switch group 18 to the current amplifiers 16, respectively. FIG. 2C illustrates the details of a circuit portion connecting the coils, switches, and the amplifiers in FIG. 2A and shows part including coils LxA1, LxA3, LxA5, RyA1, RyA3, and RyA5 extracted representatively.

Figure 3A:
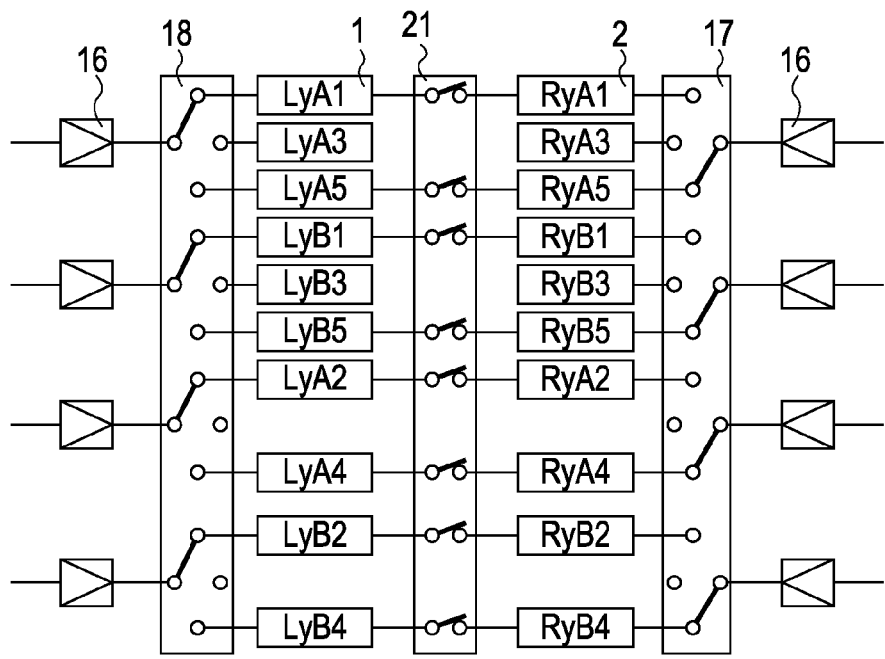
FIGS. 3A and 3B are diagrams explaining the first embodiment (during swapping).
Figure 3B:
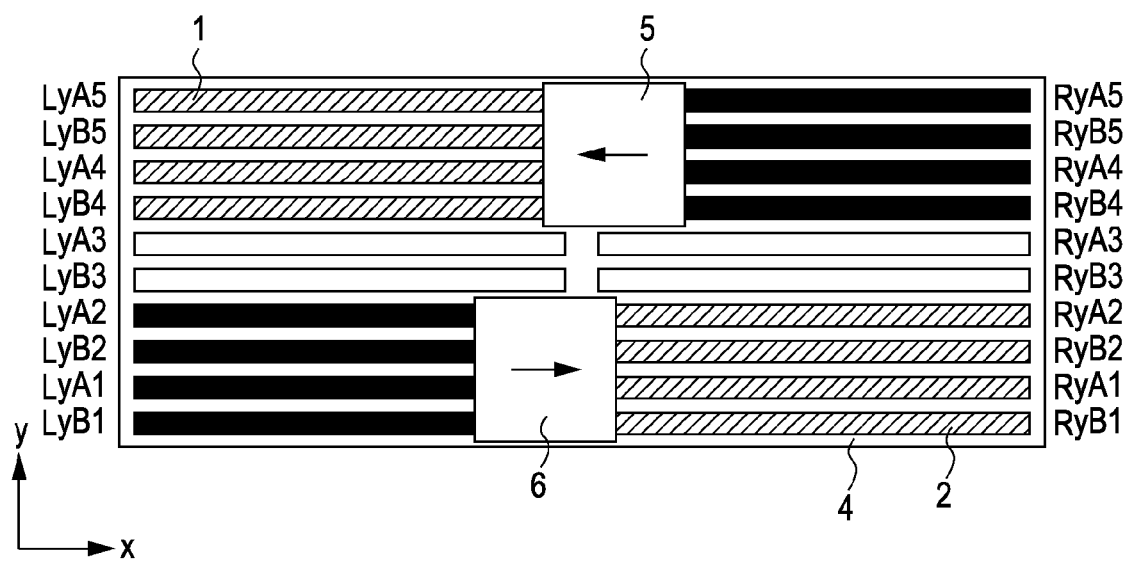

FIGS. 3A and 3B illustrate the coil switching circuit during the swapping operation in which the two stages are interchanged such that the first stage 5 is moved from the exposure station 11 to the measurement station 12 and the second stage 6 is moved from the measurement station 12 to the exposure station 11. When the two stages are located above both of the first coil array 1 and the second coil array 2 as shown in the figures, eight coils hatched in FIG. 3B have to be further excited.

In this instance, the fourth switch group 21 for connecting some coils in the second coil array 2 in the exposure station 11 to some coils in the first coil array 1 in the measurement station 12 is turned on (closed) as shown in FIG. 3A.

Figure 4A:
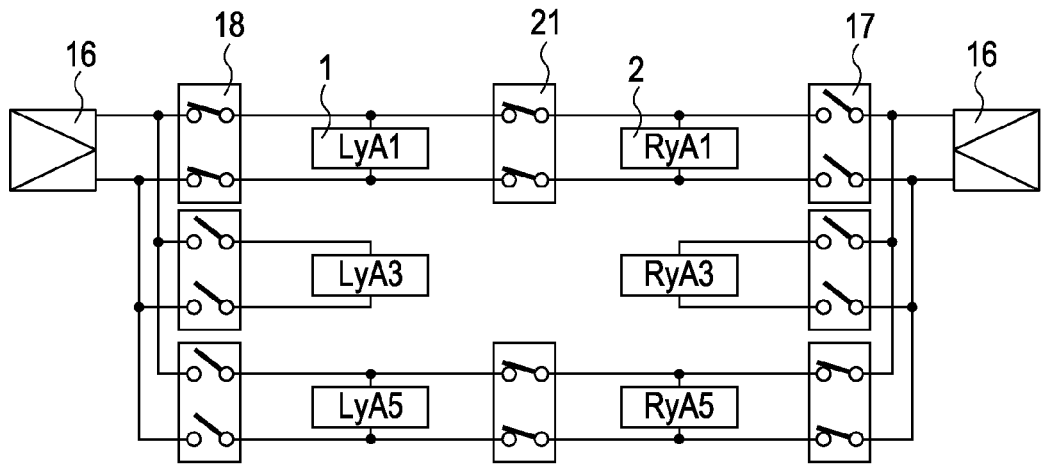
FIGS. 4A and 4B are diagrams illustrating the details of a coil connecting circuit in accordance with the first embodiment.
Figure 4B:
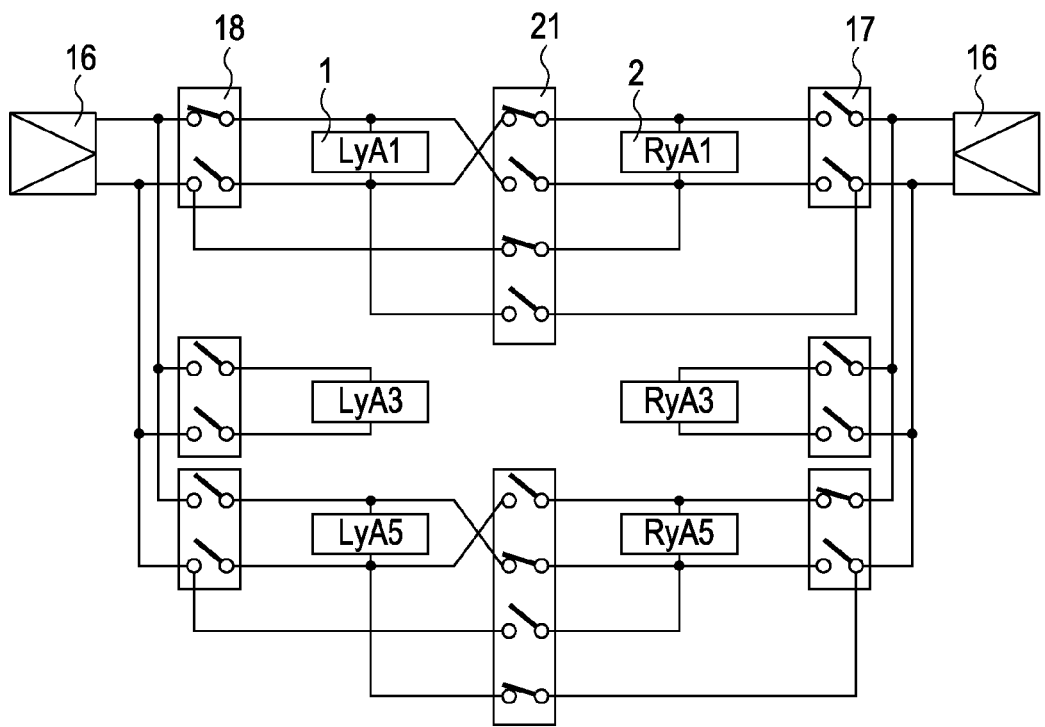

FIGS. 4A and 4B illustrate the details of the connection between the coils LyA1, LyA3, and LyA5 and the coils RyA1, RyA3, and RyA5 when the fourth switch group 21 is turned on (closed). During the swapping operation for interchanging the stages, the coils in the respective stations connected through the fourth switch group 21 may be supplied with the same current. Accordingly, either parallel connection shown in FIG. 4A or serial connection shown in FIG. 4B is available. Other coils in the first and second coil arrays are similarly connected through the fourth switch group 21.

For example, as shown in FIG. 4A, the current amplifier 16 which is excited to drive the first stage 5 is connected to the coils RyA5 and LyA5 in the two stations through the first switch group 17 and the fourth switch group 21. The current amplifier 16 which is excited to drive the second stage 6 is connected to the coils LyA1 and RyA1 in the two stations through the second switch group 18 and the fourth switch group 21.

Since each current amplifier 16 is connected to one or two coils as described above, a feedback circuit of the current amplifier may oscillate due to a difference in impedance. In general, the feedback gain of the current amplifier is adjusted to an optimum value so that no oscillation occurs in either case. According to another approach to preventing the oscillation, a dummy load coil which does not contribute to a produced force may be placed so that an output of the current amplifier has a constant impedance irrespective of a change in switching state.

As described above, the eight coils hatched in FIG. 3B can be supplied with the current during swapping without providing new current amplifiers. In addition, it is necessary to supply current for supporting each stage under its own weight and moving each movable member away from (i.e., lifting off) the stator 4 at all times. When this current is supplied to the third coil array 3 in which the connection of coils is not performed by switching in the fourth switch group 21, a sharp change in current is not caused. Thus, the stability of the accuracy for posture control of each stage can be ensured.

As for the connection of the coils, it is preferable to connect the coils opposed to each other as shown in FIG. 3B. Specifically, for example, the coils LyA2 and RyA2, the coils LyB2 and RyB2, the coils RyA5 and LyA5, and the coils RyB5 and LyB5 are connected. The reason is as follows. During movement of the stages, the posture of each stage (e.g., the rotation of the stage in the x axial direction) is also controlled. Therefore, when the stages are located in the boundary between the two stations, so long as the currents flowing through the opposed coils are in phase, the posture control can be easily performed.

Figure 5A:
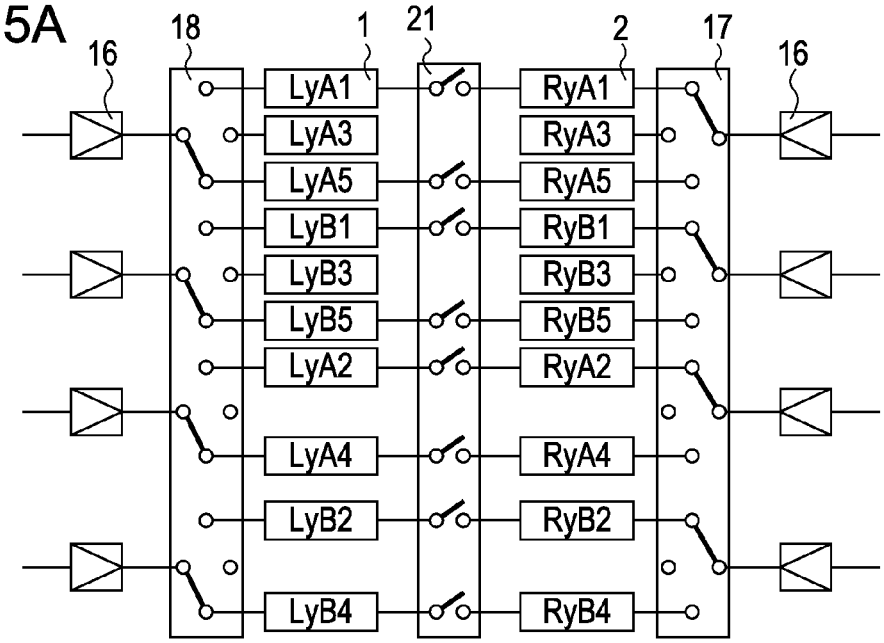
FIGS. 5A to 5C are diagrams explaining the first embodiment (after swapping).
Figure 5B:
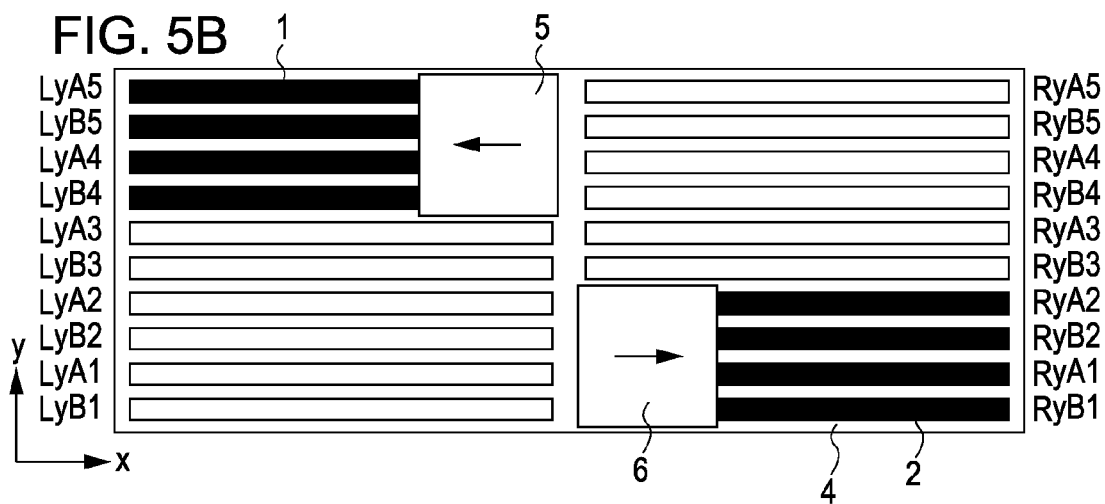
Figure 5C:
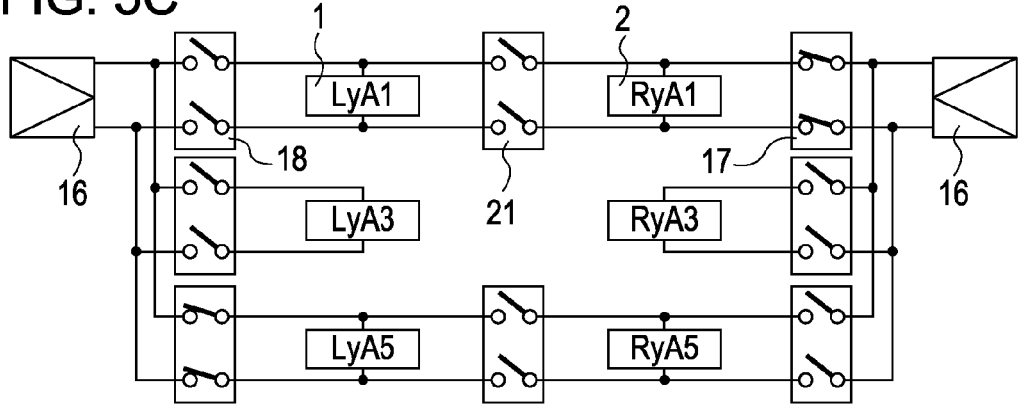

FIGS. 5A to 5C illustrate a state in which the two stages have passed above the fourth coil array 22 and been interchanged between the stations. Referring to FIG. 5A, while the fourth switch group 21 is turned off (open), contacts in the first switch group 17 and those in the second switch group 18 are appropriately changed over, so that the first coil array 1 and the second coil array 2 can be connected to the current amplifiers 16. Consequently, the stages can be continuously driven after the swapping operation for interchanging the stages. More specifically, after the swapping operation, one of the two stages can be independently driven above one of the first and second coil arrays and the other stage can be independently driven above the other coil array.

Recently, a liquid immersion exposure apparatus has attracted attention. In the liquid immersion exposure apparatus, as shown in FIG. 6C, the gap between a projection optical system 14 and a wafer 13 mounted on a stage is filled with ultra pure water (liquid having a high refractive index) 23 to increase the resolution. Since it is necessary to hold the ultra pure water in the gap between the projection optical system 14 and the wafer 13 in the liquid immersion exposure apparatus at all times, the stage has to be located below the projection optical system 14. For this reason, the swapping operation for interchanging two stages has to be performed in an exposure station 11.

Figure 6A:
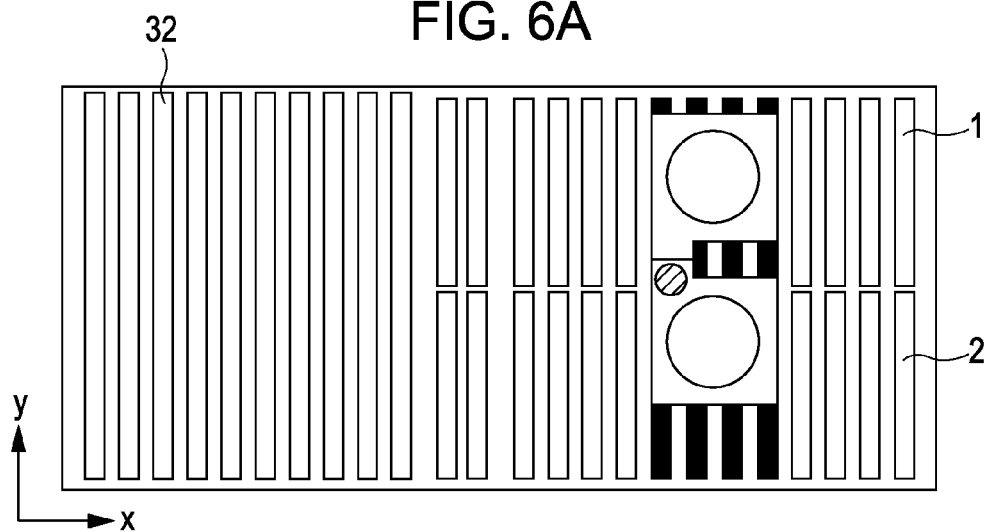
FIGS. 6A to 6C are diagrams explaining a second embodiment of the present invention (during swapping).

Referring to FIG. 6A, a stage unit according to a second embodiment of the present invention includes a first coil array 1 in which first coils extending in the y direction are arranged in the x direction and a second coil array 2 in which second coils extending in the y direction are arranged in the x direction. The two coil arrays are disposed adjacent to each other in the y direction. In addition, a fifth coil array 32 in which fifth coils having a length in the y direction longer than the lengths of the first and second coils are arranged in the x direction is located next to the arrangement of the first coil array 1 and the second coil array 2 in the x direction.

Figure 6B:
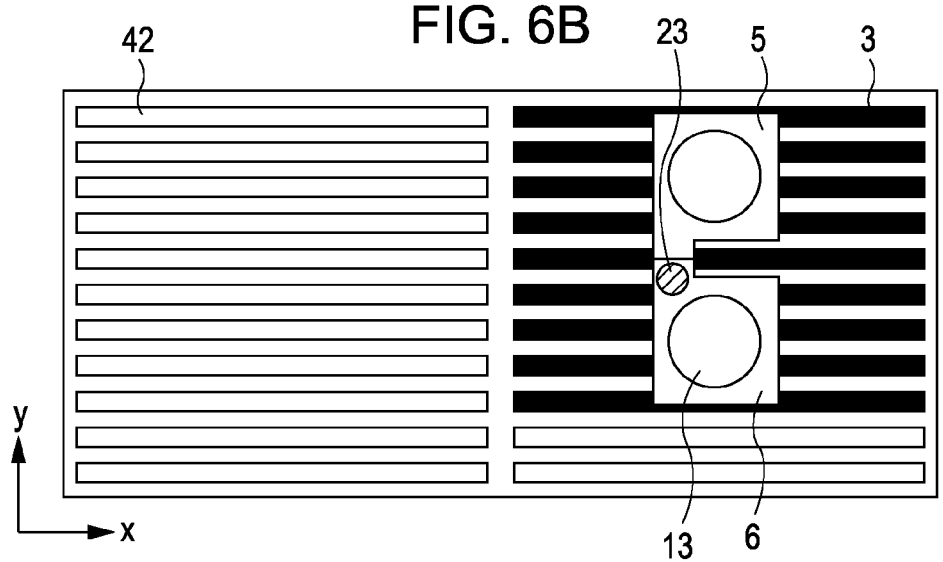
Figure 6C:
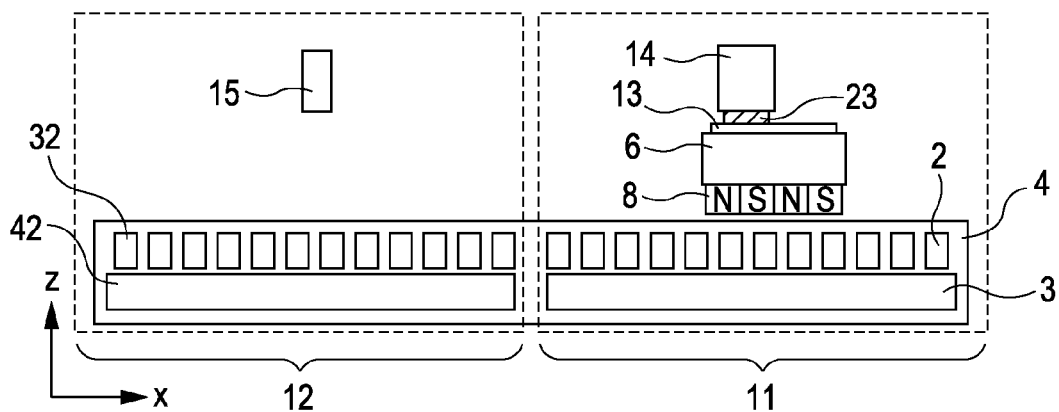

As shown in FIGS. 6B and 6C, a third coil array 3 in which third coils extending in the x direction are arranged in the y direction is placed within a stator 4 such that the third coil array 3 underlies the first coil array 1 and the second coil array 2. In addition, a sixth coil array 42 in which sixth coils extending in the x direction are arranged in the y direction is located next to the third coil array 3 in the x direction.

In a measurement station 12, as shown in FIG. 6C, the sixth coil array 42 is placed within the stator 4 such that the sixth coil array 42 underlies the fifth coil array 32.

As shown in FIG. 6A, so long as the coil arrays used to produce a drag force in the x direction are located away from each other in the exposure station 11, the currents supplied to the coil arrays in the exposure station 11 can be controlled independently of each other. Thus, the swapping operation can be performed in the exposure station 11.

Figure 7A:
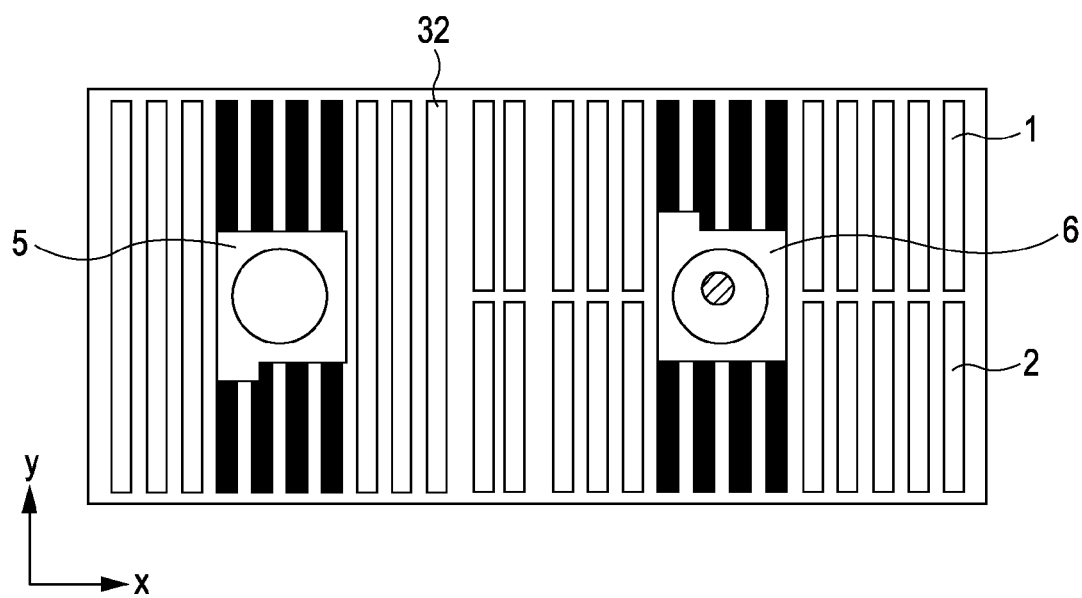
FIGS. 7A and 7B are diagrams explaining the second embodiment (after swapping).
Figure 7B:
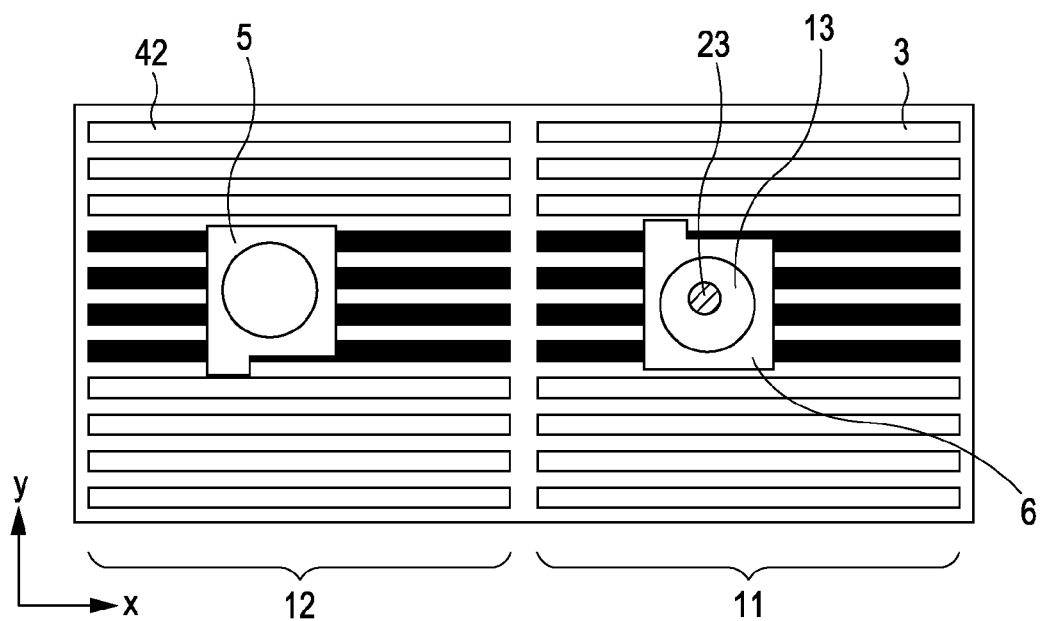

After swapping, as shown in FIGS. 7A and 7B, the exposure operation on a second stage 6 is started in the exposure station 11. As shown in FIG. 7A, the second stage 6 has to be subjected to exposure such that the second stage 6 is located above both of the first coil array 1 and the second coil array 2 in the vicinity of the center of the exposure station 11. In this case, a fourth switch group 21 connecting the first coil array 1 to the second coil array 2 in the exposure station 11 is provided in the same way as the first embodiment, so that the second stage 6 can be driven in the exposure station 11 without increasing the number of current amplifiers.

Figure 8A:
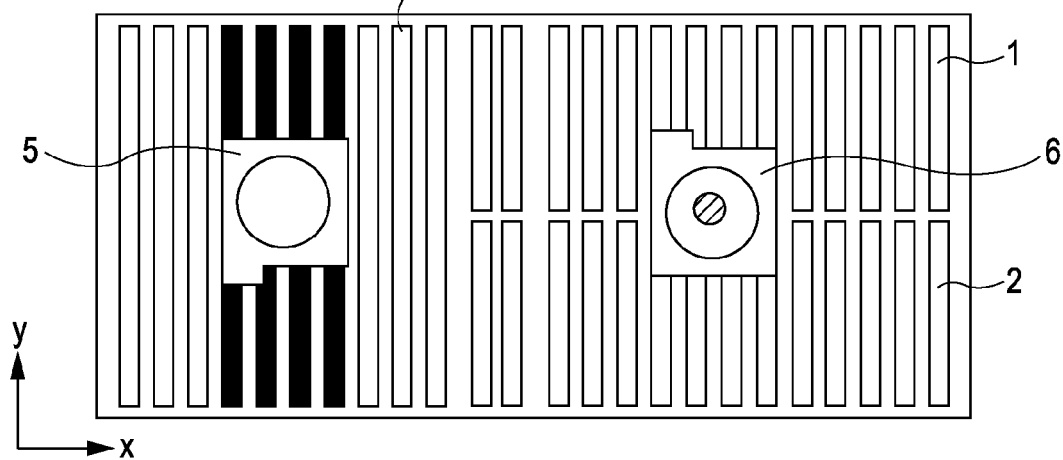
FIGS. 8A to 8C are diagrams explaining the second embodiment (after swapping).
Figure 8B:
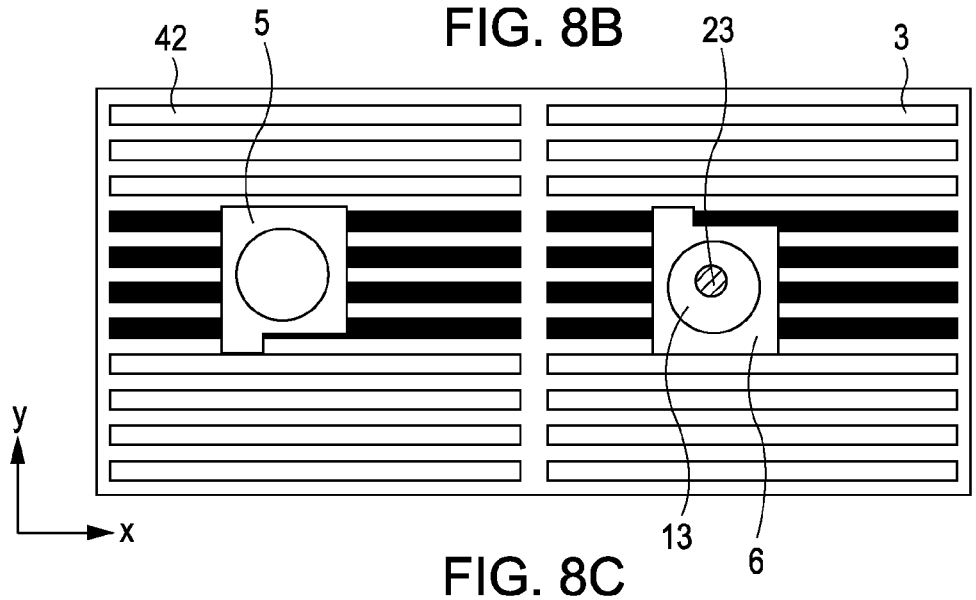
Figure 8C:
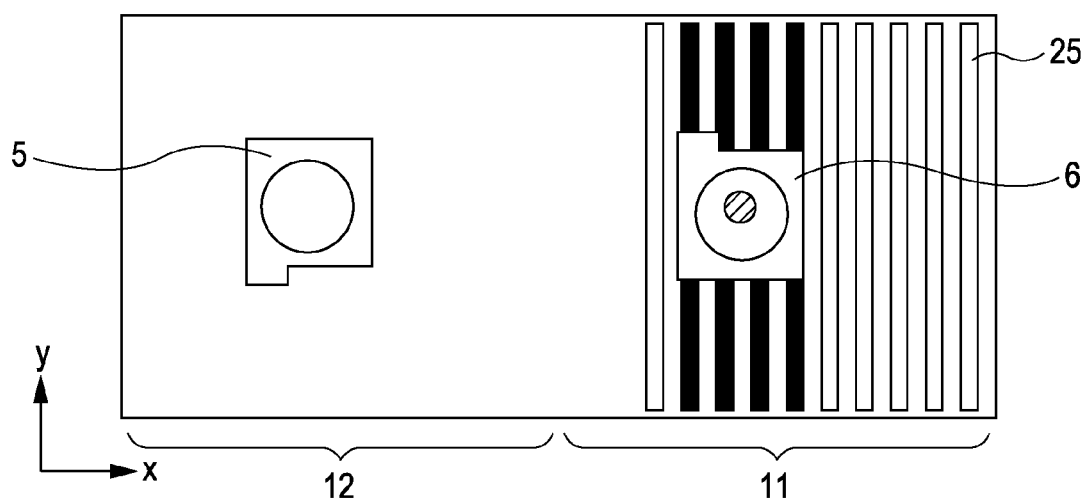
Figure 11A:
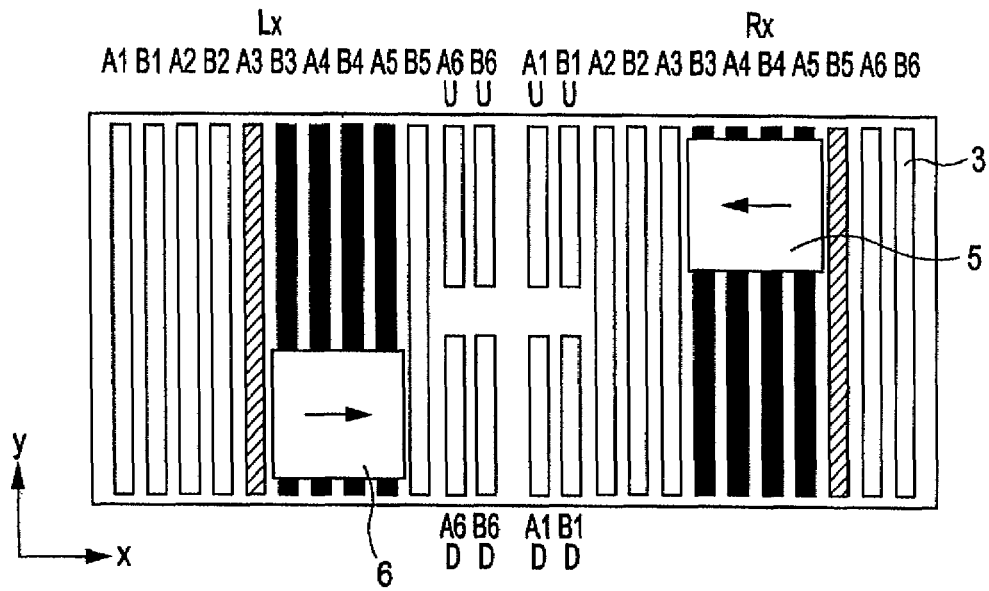
FIGS. 11A and 11B are diagrams explaining the related-art unit (before swapping).
Figure 11B:
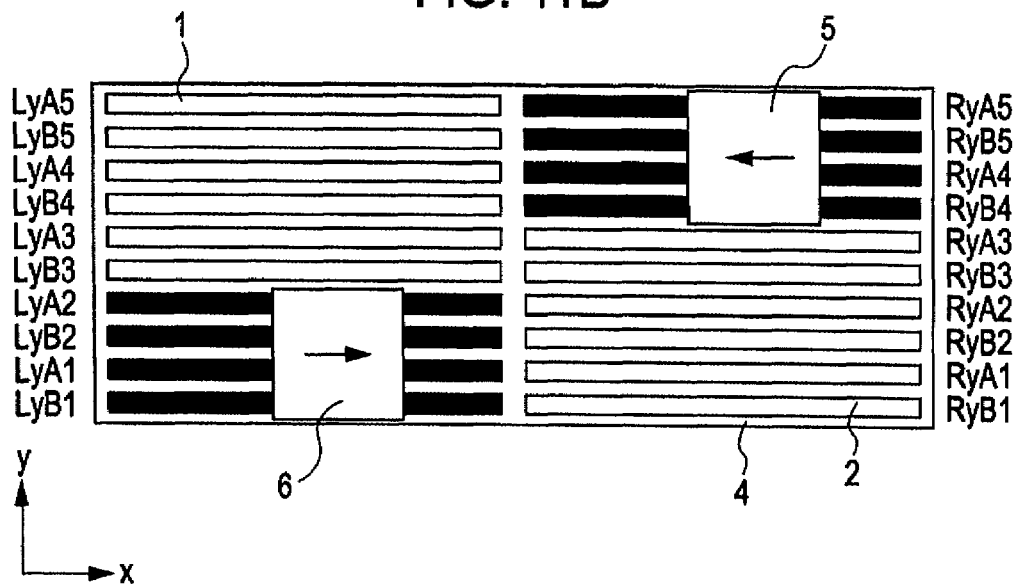
Figure 12:
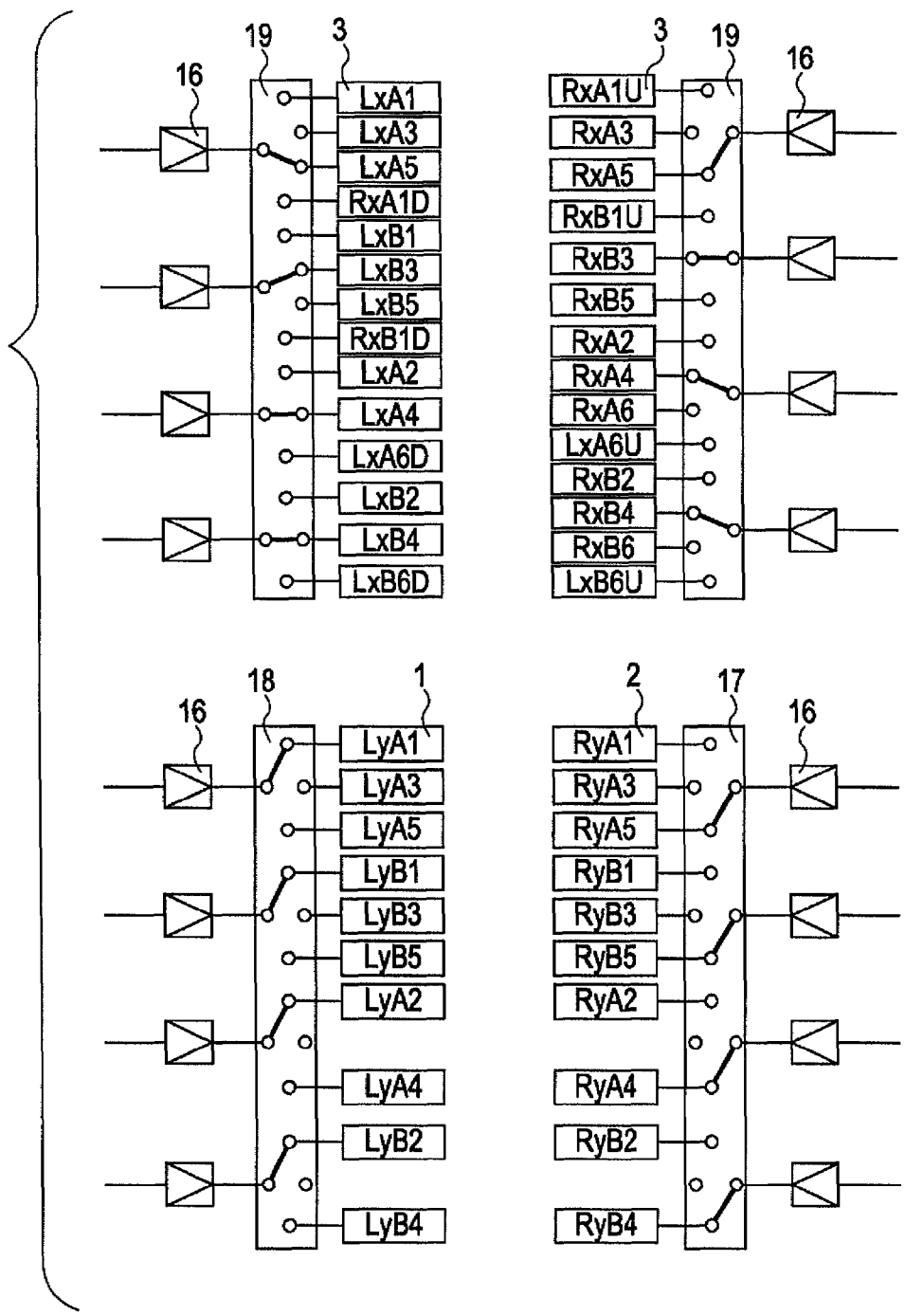
FIG. 12 illustrates a related-art coil switching circuit (before swapping).
Figure 13A:
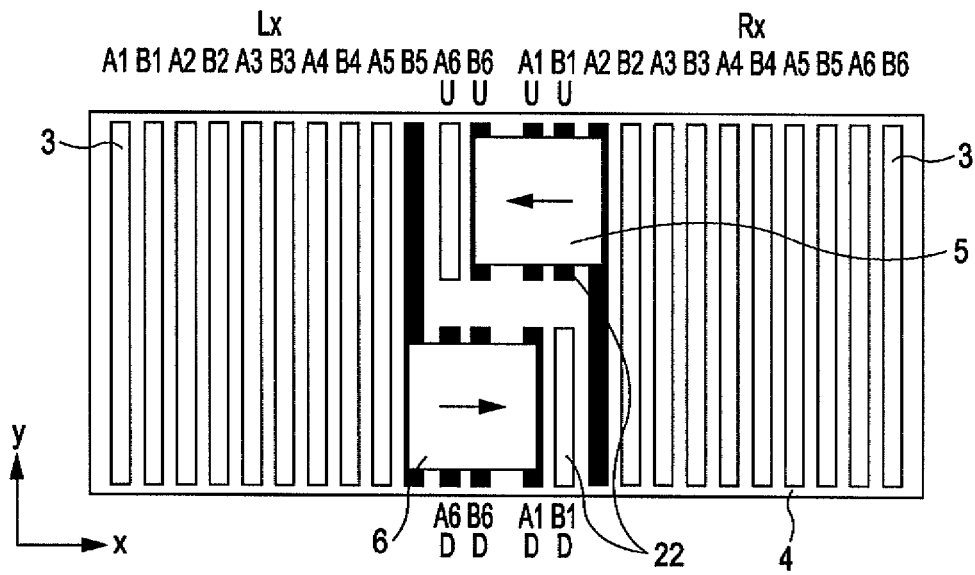
FIGS. 13A and 13B are diagrams explaining the related-art unit (during swapping).
Figure 13B:
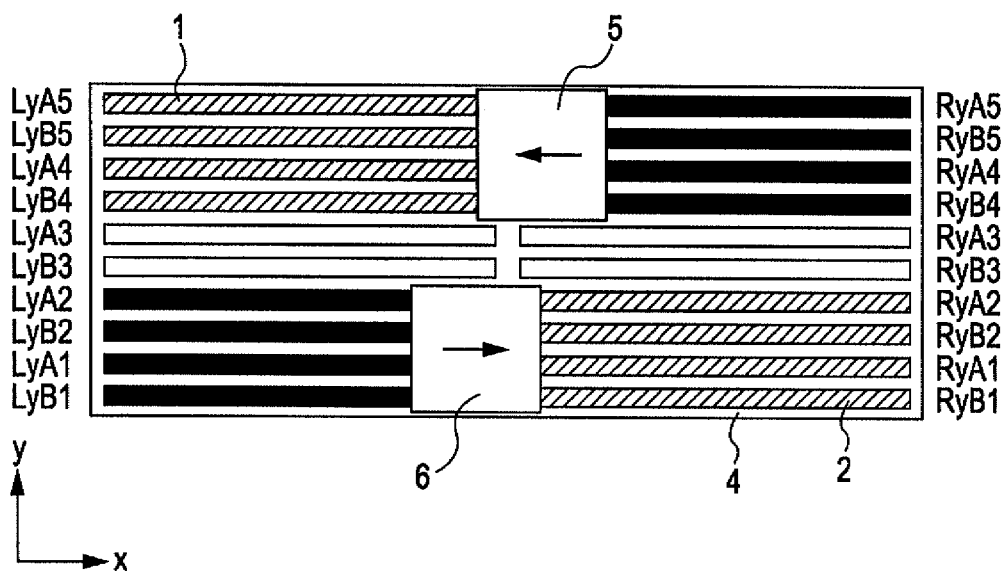
Figure 14:
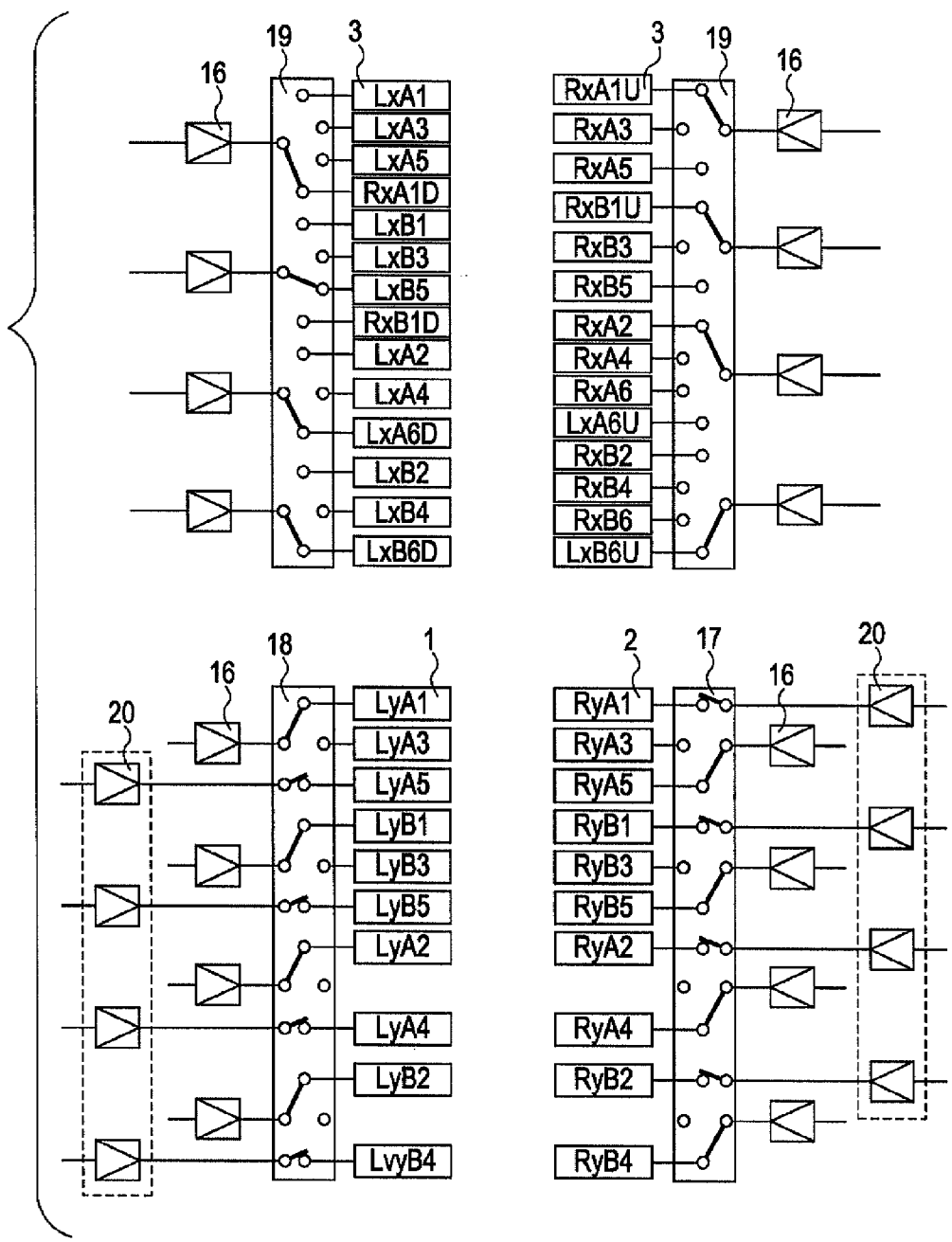
FIG. 14 illustrates a related-art coil switching circuit (during swapping).
Figure 15A:
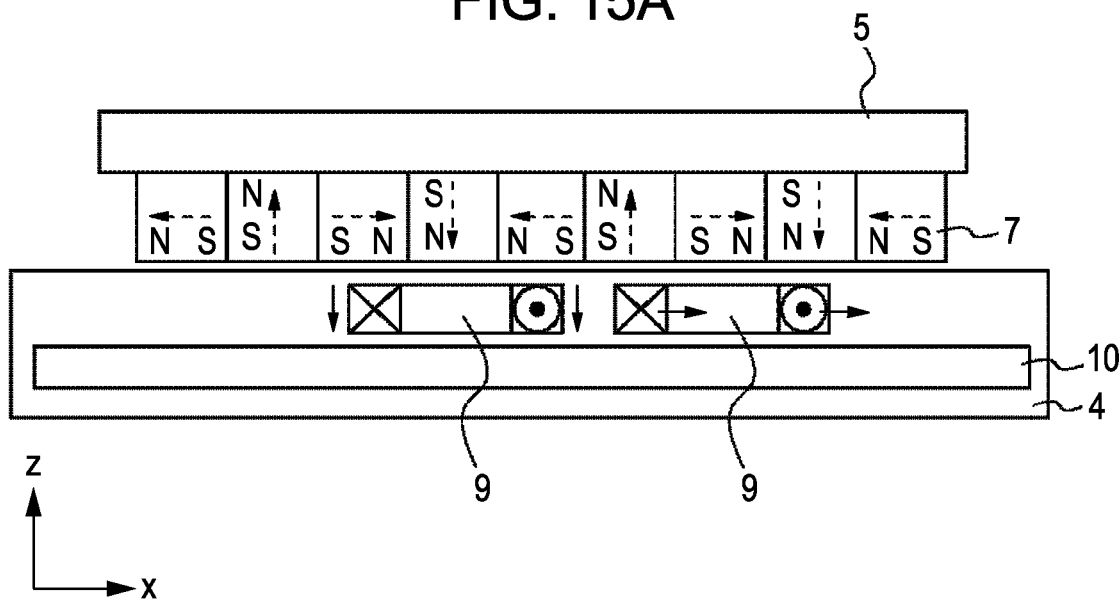
FIGS. 15A and 15B are diagrams explaining the principle of driving a planar motor.
Figure 15B:
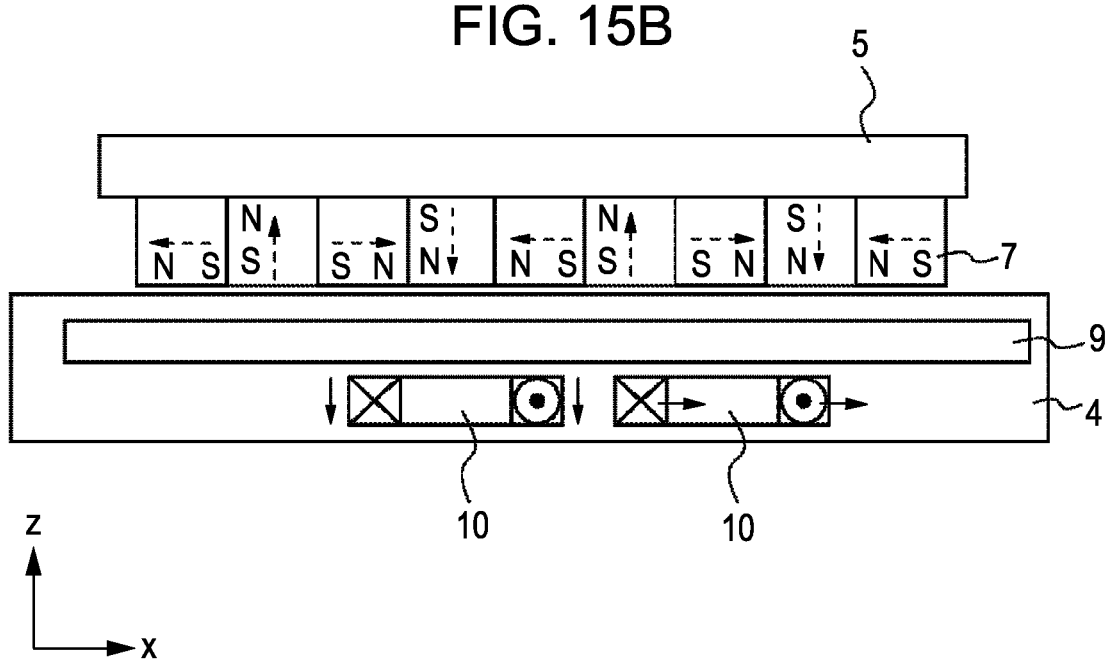

When the movable member moves above the boundary between the first coil array 1 and the second coil array 2 in the exposure station 11, as shown in FIG. 8A, an unnecessary external force may be produced in the boundary therebetween and affect the positioning accuracy. Therefore, a seventh coil array 25 which is excited during the exposure operation can be further placed in the exposure station 11 so as to cover the coil arrays as shown in FIG. 8C.

It is necessary to supply current for supporting each stage under its own weight and moving each movable member away from (i.e., lifting off) the stator 4 at all times. When this current is supplied to the third coil array 3 in which the connection of coils is not performed by switching in the fourth switch group 21, a sharp change in current is not caused. Thus, the stability of the accuracy for posture control of each stage can be ensured.

FIGS. 9A to 9C illustrate the structure of a triple stage unit in which two measurement stations 12 are arranged adjacent to one exposure station 11 to further increase the throughput. Upper coils 9 and lower coils 10 are arranged as two layers within a stator 4.

Referring to FIGS. 9A and 9B, the two measurement station 12 are disposed adjacent to the one exposure station 11 such that one measurement station is located next to the exposure station in the x direction and the other measurement station is located next thereto in the y direction.

A fourth switch group 21 connecting some coils in a first coil array 1 in the measurement station 12 to some coils in a second coil array 2 and a fifth switch group 26 connecting some coils in a third coil array 3 to some coils in an eighth coil array 33 in the other measurement station 12 are provided.

A wafer 13 mounted on a first stage 5 is exposed through a projection optical system 14 in the exposure station 11. Simultaneously, a wafer on a second stage 6 and that mounted on a third stage 24 are measured through respective measurement optical systems in the two measurement stations 12, respectively.

After the exposure on the first stage 5, the swapping operation for interchanging the first stage 5 and either the second stage 6 or the third stage 24 on which the measurement has been completed first is performed. When the measurement on the second stage 6 is completed first, the fourth switch group 21 is closed to connect the first coil array 1 to the second coil array 2. Thus, the swapping operation for interchanging the stages can be performed.

Whereas, when the measurement on the third stage 24 is completed first, the fifth switch group 26 is closed to connect the third coil array 3 to the eighth coil array 33. Thus, the swapping operation for interchanging the stages can be performed.

When the present invention is applied to a positioning stage unit in which three or more stages are arranged above the stator 4, the swapping operation for interchanging two stages can be performed without increasing the number of current amplifiers. Thus, the positioning stage unit exhibiting excellent throughput can be provided.

Figure 16:
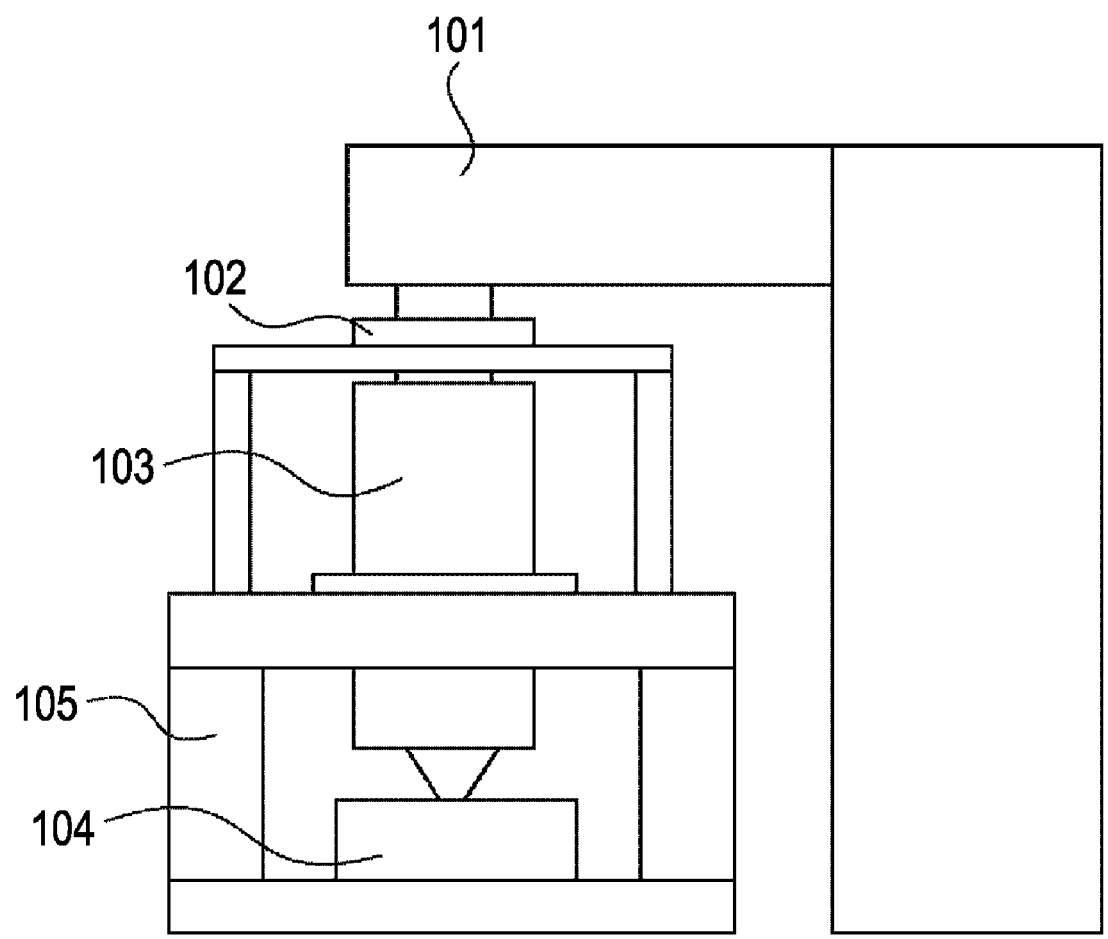
FIG. 16 is a diagram explaining an exposure apparatus.

An exemplary exposure apparatus including the stage unit according to any of the embodiments of the present invention will now be described. Referring to FIG. 16, the exposure apparatus has a main body 105 including an illumination unit 101, a reticle stage 102 on which a reticle is mounted, a projection optical system 103, and a wafer stage 104 on which a wafer is mounted. The exposure apparatus exposes a wafer while projecting a circuit pattern formed in the reticle onto the wafer. A step-and-repeat projection exposure method or a step-and-scan projection exposure method may be used.

The illumination unit 101 irradiates the reticle in which the circuit pattern is formed and includes a light source and an illumination optical system. As for the light source, for example, a laser is used. As for the laser, an ArF excimer laser having a wavelength of about 193 nm, a KrF excimer laser having a wavelength of about 248 nm, or an F2 excimer laser having a wavelength of about 157 nm is available. The type of laser is not limited to the excimer laser. For example, a YAG laser may be used. The number of lasers is not limited. When a laser is used as the light source, it is preferable to use a light flux shaping optical system that shapes a collimated light beam emitted from the laser source into a desired beam form and an incoherent optical system that converts a coherent laser beam into an incoherent laser beam. The available light source is not limited to a laser. At least one lamp, such as a mercury lamp or a xenon lamp, may be used.

The illumination optical system, which serves as an optical system for irradiating a mask, includes a lens, a mirror, a light integrator, and a limiting device.

As for the projection optical system 103, an optical system including only lens elements or an optical system (catadioptric optical system) including lens elements and at least one concave mirror may be used. Alternatively, an optical system including lens elements and at least one diffractive optical element, such as a kinoform, or a full mirror type optical system may be used.

The reticle stage 102 and the wafer stage 104 can be moved by, for example, a linear motor. In the use of the step-and-scan projection exposure method, these stages are moved synchronously. At least one of the reticle stage 102 and the wafer stage 104 is provided with an actuator for aligning a pattern in the reticle with the wafer.

Such an exposure apparatus can be used in manufacture of a semiconductor device, such as a semiconductor integrated circuit, or a device, such as a micromachine or a thin film magnetic head, in which a fine pattern is formed.

Device Manufacturing Method

A device is manufactured by a device manufacturing method according to an embodiment of the present invention, the method including the steps of exposing a substrate using an exposure apparatus including the stages in accordance with any of the above-described embodiments, developing the exposed substrate, and processing the developed substrate.

The device includes a semiconductor integrated circuit element or a liquid crystal display element.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Patent Application No. 2008-100417 filed Apr. 8, 2008, which is hereby incorporated by reference herein in its entirety.

What is claimed is:

1. A stage unit comprising:
 a stator that includes:
  a first coil array in which first coils extending in a first direction are arranged in a second direction perpendicular to the first direction;
  a second coil array in which second coils extending in the first direction are arranged in the second direction, the second coil array being located next to the first coil array in the first direction; and
  a third coil array in which third coils extending in the second direction are arranged in the first direction, the third coil array covering the first coil array and the second coil array;
 a movable member that includes a magnet located above the stator and a stage to which the magnet is attached;
 a controller that controls driving of the movable member by allowing a current amplifier to supply current to the coils extending in the first direction and allowing another current amplifier to supply current to the coils extending in the second direction; and
 a switch that is capable of connecting a first coil to a second coil.

2. The stage unit according to claim 1,
 wherein the controller controls the driving of the movable member by supplying current to a predetermined number of coils selected from the coils extending in the first direction through the predetermined number of current amplifiers and supplying current to a predetermined number of coils selected from the coils extending in the second direction through the predetermined number of other current amplifiers,
 wherein the stage unit includes a switch group including a plurality of the switches, and
 wherein the switch group is placed between at least some of the first coils in the first coil array and at least some of the second coils in the second coil array, the at least some second coils being located adjacent to the at least some first coils.

3. The stage unit according to claim 2,
 wherein the movable member includes a first movable member and a second movable member arranged above the stator, the first movable member including a first magnet and a first stage to which the first magnet is attached, the second movable member including a second magnet and a second stage to which the second magnet is attached, and
 wherein the controller controls driving of the first movable member and driving of the second movable member by supplying current to a predetermined number of coils selected from the coils extending in the first direction through the predetermined number of current amplifiers and supplying current to a predetermined number of coils selected from the coils extending in the second direction through the predetermined number of other current amplifiers.

4. The stage unit according to claim 3,
 wherein when the switch group switches on the connection between the at least some first coils and the at least some second coils, the first and second movable members are interchangeable above the first and second coil arrays such that one movable member moves from one coil array to the other coil array and the other movable member moves from the other coil array to the one coil array, and
 wherein when the switch group switches off the connection therebetween, the first and second movable members are movable independently of each other such that one movable member is located above the first coil array and the other movable member is located above the second coil array.

5. The stage unit according to claim 3, wherein the third coil array includes a first array segment, a second array segment, and a fourth coil array such that the first and second array segments sandwich the fourth coil array in which each pair of fourth coils, each extending in the second direction, is placed in the second direction and the pairs of fourth coils are arranged in the first direction, the first and second array segments and the fourth coil array being disposed in the first direction.

6. The stage unit according to claim 3,
 wherein when the switch group switches on the connection between the at least some first coils and the at least some second coils, the first movable member or the second movable member is movable above the first and second coil arrays so as to move from one coil array to the other coil array, and
 wherein when the switch group switches off the connection therebetween, the first and second movable members are movable independently of each other such that one movable member is located above the first coil array and the other movable member is located above the second coil array.

7. The stage unit according to claim 3, wherein current for moving the first and second movable members away from the stator is supplied to the third coils in the third coil array.

8. An exposure apparatus for exposing a substrate, the apparatus comprising:
 an illumination unit supplying light to which the substrate is exposed; and
 a stage unit moving while holding the substrate, the stage unit including:
  a stator that includes:
   a first coil array in which first coils extending in a first direction are arranged in a second direction perpendicular to the first direction;
   a second coil array in which second coils extending in the first direction are arranged in the second direction, the second coil array being located next to the first coil array in the first direction; and
   a third coil array in which third coils extending in the second direction are arranged in the first direction, the third coil array covering the first coil array and the second coil array;
  a movable member that includes a magnet located above the stator and a stage to which the magnet is attached;

a controller that controls driving of the movable member by allowing a current amplifier to supply current to the coils extending in the first direction and allowing another current amplifier to supply current to the coils extending in the second direction; and a switch that is capable of connecting a first coil to a second coil.

9. The exposure apparatus according to claim 8, wherein the movable member includes a first movable member and a second movable member arranged above the stator, the first movable member including a first magnet and a first stage to which the first magnet is attached, the second movable member including a second magnet and a second stage to which the second magnet is attached, wherein the controller controls driving of the first movable member and driving of the second movable member by supplying current to a predetermined number of coils selected from the coils extending in the first direction through the predetermined number of current amplifiers and supplying current to a predetermined number of coils selected from the coils extending in the second direction through the predetermined number of other current amplifiers, wherein the stage unit includes a switch group including a plurality of the switches, the switch group being located between at least some of the first coils in the first coil array and at least some of the second coils in the second coil array, the at least some second coils being located adjacent to the at least some first coils, wherein the exposure apparatus further comprises:
  a measurement station in which a first substrate held on one of the first and second stages moved by the first coil array and the third coil array is measured; and
  an exposure station in which the first substrate, held on the one of the first and second stages moved by the second and third coil arrays and measured in the measurement station, is exposed, wherein simultaneously with the exposure of the first substrate in the exposure station, a second substrate held on the other one of the first and second stages moved by the first and third coil arrays is measured in the measurement station, and wherein the first movable member and the second movable member are interchangeable such that one movable member is moved from the measurement station to the exposure station and the other movable member is moved from the exposure station to the measurement station.

10. The apparatus according to claim 9, wherein the measurement station includes two measurement stations, wherein one of the two measurement stations is located next to the exposure station in the first direction, and wherein the other measurement station is located next to the exposure station in the second direction.

11. The apparatus according to claim 8, wherein the movable member includes a first movable member and a second movable member arranged above the stator, the first movable member including a first magnet and a first stage to which the first magnet is attached, the second movable member including a second magnet and a second stage to which the second magnet is attached, wherein the controller controls driving of the first movable member and driving of the second movable member by supplying current to a predetermined number of coils selected from the coils extending in the first direction through the predetermined number of current amplifiers and supplying current to a predetermined number of coils selected from the coils extending in the second direction through the predetermined number of other current amplifiers, wherein the stage unit includes a switch group including a plurality of the switches, the switch group being located between at least some of the first coils in the first coil array and at least some of the second coils in the second coil array, the at least some second coils being located adjacent to the at least some first coils, wherein when the switch group switches on the connection between the at least some first coils and the at least some second coils, the first movable member or the second movable member is movable above the first and second coil arrays so as to move from one coil array to the other coil array, and when the switch group switches off the connection therebetween, the first and second movable members are movable independently of each other such that one movable member is located above the first coil array and the other movable member is located above the second coil array, wherein the exposure apparatus further comprises:
  a measurement station in which a first substrate held on one of the first and second stages moved by at least the first and second coil arrays is measured; and
  an exposure station in which the first substrate, held on the one stage moved by the first, second, and third coil arrays and measured in the measurement station, is exposed, wherein simultaneously with the exposure of the first substrate in the exposure station, a second substrate held on the other one of the first and second stages moved by at least the first and second coil arrays is measured in the measurement station, and wherein the first movable member and the second movable member are interchangeable such that one movable member is moved from the measurement station to the exposure station and the other movable member is moved from the exposure station to the measurement station by moving the first and second movable members independently of each other above the first coil array and the second coil array such that one movable member is located above the first coil array and the other movable member is located above the second coil array.

12. The exposure apparatus according to claim 11, wherein the exposure station includes a projection optical system projecting light onto the substrate, wherein the measurement station includes at least one of a measuring device that measures the position of the surface of the substrate in the direction parallel to the optical axis of the projection optical system and a measuring device that measures the position of a mark formed in the substrate, and wherein the substrate is exposed through liquid with which the gap between the projection optical system and the substrate is filled.

13. A device manufacturing method comprising:

exposing a substrate using an exposure apparatus; and
developing the exposed substrate, wherein the exposure apparatus includes:
  an illumination unit that supplies light to which a substrate is exposed; and
  a stage unit that moves while holding the substrate, the stage unit including:
    a stator that includes:

a first coil array in which first coils extending in a first direction are arranged in a second direction perpendicular to the first direction;

a second coil array in which second coils extending in the first direction are arranged in the second direction, the second coil array being located next to the first coil array in the first direction; and a third coil array in which third coils extending in the second direction are arranged in the first direction, the third coil array covering the first coil array and the second coil array;

a movable member that includes a magnet located above the stator and a stage to which the magnet is attached;

a controller that controls driving of the movable member by allowing a current amplifier to supply current to the coils extending in the first direction and allowing another current amplifier to supply current to the coils extending in the second direction; and a switch that is capable of connecting a first coil to a second coil.

* * * * *